United States Patent
Park

(10) Patent No.: US 6,706,590 B2
(45) Date of Patent: Mar. 16, 2004

(54) METHOD OF MANUFACTURING SEMICONDUCTOR DEVICE HAVING ETCH STOPPER FOR CONTACT HOLE

(75) Inventor: Shin Seung Park, Seoul (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/287,786

(22) Filed: Nov. 5, 2002

(65) Prior Publication Data

US 2003/0113966 A1 Jun. 19, 2003

(30) Foreign Application Priority Data

Dec. 15, 2001 (KR) .......... 2001-79655

(51) Int. Cl.[7] .......... H01L 21/8242
(52) U.S. Cl. .......... 438/253; 438/256; 438/396; 438/634; 438/734; 438/740
(58) Field of Search .......... 438/199, 200, 438/275, 279, 239, 241, 250, 253, 256, 393, 396, 399, 586, 597, 622, 634, 734, 740

(56) References Cited

U.S. PATENT DOCUMENTS 5,670,404 A * 9/1997 Dai .......... 438/239

* cited by examiner

Primary Examiner—Jack Chen
(74) Attorney, Agent, or Firm—Jacobson Holman PLLC

(57) ABSTRACT

The present invention relates to a method of manufacturing a semiconductor device. The method includes forming an etch stopper of a nitride-series material having a high etch select ratio for an interlayer insulating film of an oxide-series material is formed on a lower unit device. Therefore, plasma-introduced damage of the lower unit device can be prevented upon a metal contact process for connecting the lower unit device and an upper metal line.

11 Claims, 3 Drawing Sheets

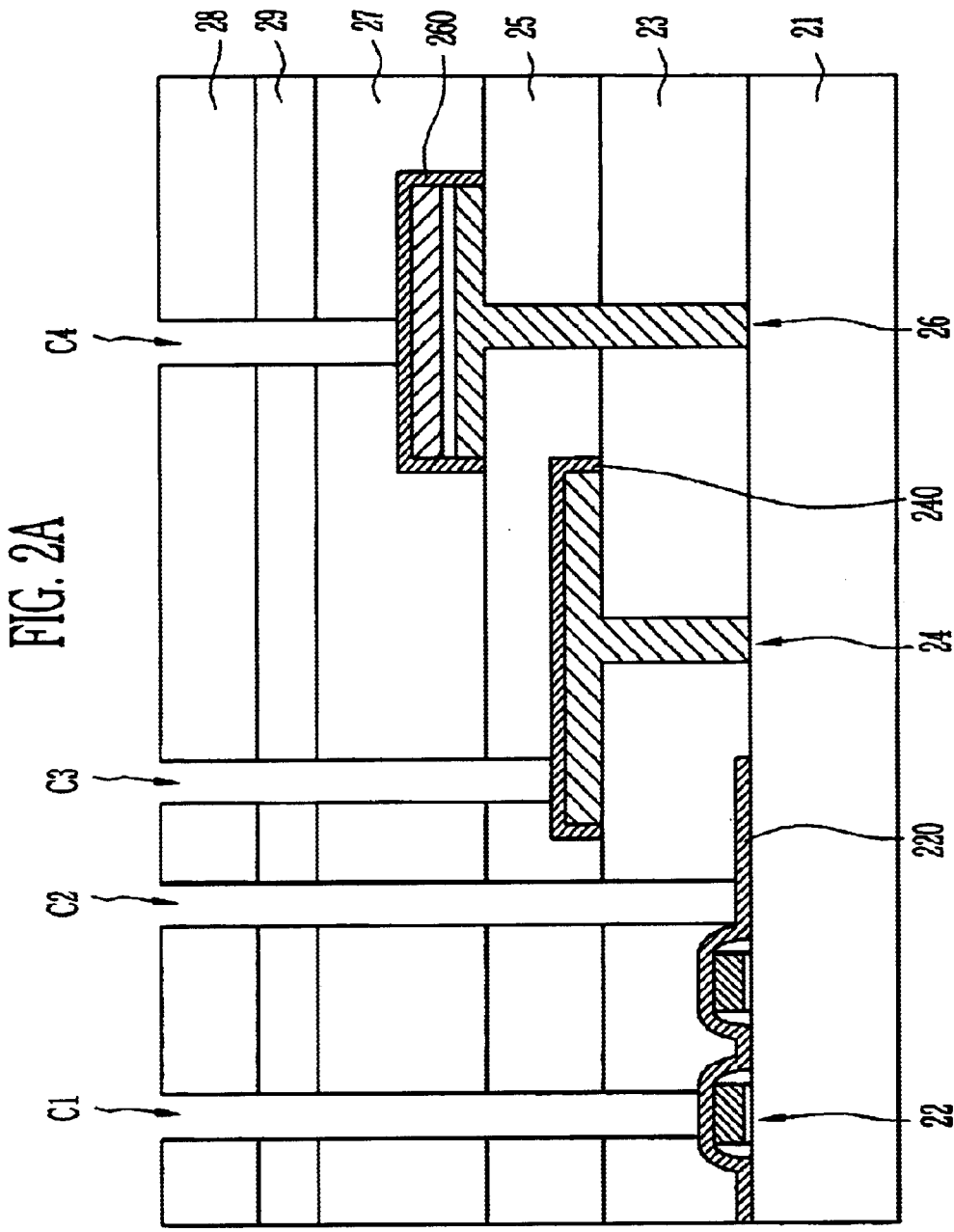

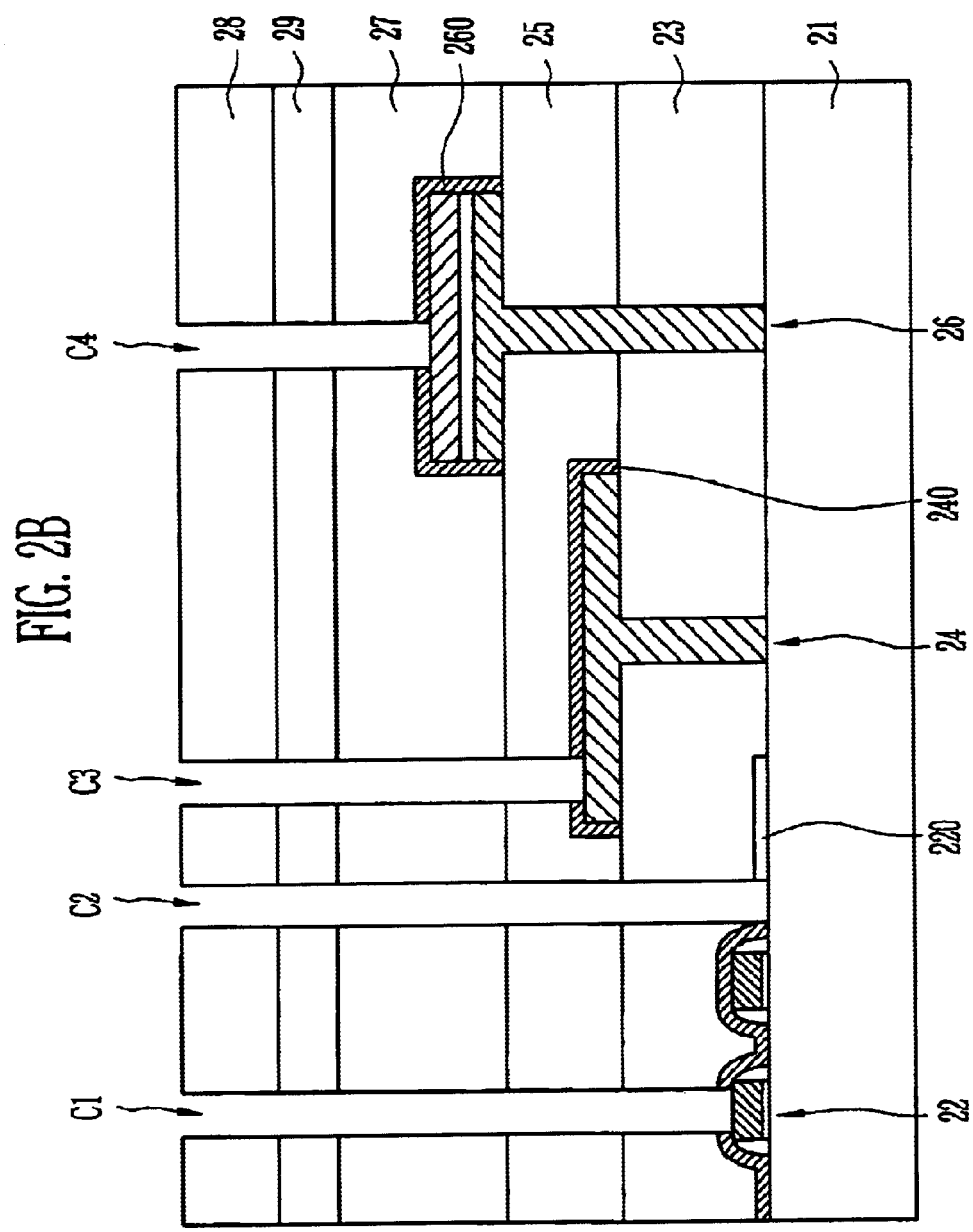

METHOD OF MANUFACTURING SEMICONDUCTOR DEVICE HAVING ETCH STOPPER FOR CONTACT HOLE

BACKGROUND OF THE INVENTION

1. Field of the Invention

The invention relates generally to a method of manufacturing a semiconductor device, and more particularly to, a method of manufacturing a semiconductor device capable of preventing plasma-introduced damage of a lower unit device upon a metal contact process for connecting the lower unit device and an upper metal line.

2. Description of the Prior Art

Generally, in a process of manufacturing a semiconductor device, a metal contact process is performed in order to connect a lower unit device and an upper metal line. A plasma dry etch technology for forming a contact hole in the metal contact process includes a main etch process for an etch subject layer and an over-etch process that is performed from the time when the lower conductive layer begins to expose.

FIG. 1 is a cross-sectional view of a semiconductor device for explaining a conventional method of manufacturing the device.

Referring now to FIG. 1, a word line 12 is formed on a semiconductor substrate 11. A first interlayer insulating film 13 of which the surface is planarized is then formed on the word line 12. Next, a portion of the first interlayer insulating film 13 is etched. A bit line 14 connected to the semiconductor substrate 11 through the etch portion is formed on the first interlayer insulating film 13. A second interlayer insulating film 15 of which the surface is planarized is formed on the bit line 14. Thereafter, portions of the first and second interlayer insulating films 13 and 15 are etched. Next, a capacitor 16 connected to the semiconductor substrate 11 through the etched portions is formed on the second interlayer insulating film 15. A third interlayer insulating film 17 of which the surface is planarized is formed on the capacitor 16.

The lower unit device is completed by the above process. A metal contact process for connecting the lower unit device and a metal line is then performed.

The metal contact process includes forming a photoresist pattern 18 through which a portion of each of the word line 12, the semiconductor substrate 11 in the active region, the bit line 14 and the capacitor 16 is opened on the third interlayer insulating film 17, and then sequentially etching the third, second and first interlayer insulating films 17, 15 and 13 by means of a plasma dry etch process using the photoresist pattern 18 as an etch mask, thus forming contact holes C1, C2, C3 and C4.

The plasma dry etch process includes a main etch process for the etch subject layers 17, 15 and 13, and an over-etch process that is performed from the time when the lower conductive layers 11, 12, 14 and 16 begin to expose. At this time, a word line contact hole C1 through which a portion of the word line 12 is exposed, a substrate contact hole C2 through which a portion of the semiconductor substrate 11 in the active region is exposed, a bit line contact hole C3 through which a portion of the bit line 14 is exposed, and a capacitor contact hole C4 through which a portion of the capacitor 16 is exposed, are simultaneously formed by the above processes. Each of the word line contact hole C1, the substrate contact hole C2, the bit line contact hole C3 and the capacitor contact hole C4 has a different depth since the lower conductive layers 11, 12, 14 and 16 are formed at different locations of the four contact holes C1, C2, C3 and C4.

In the above, the over-etch process is performed in order to remove the etch subject layers 13, 15 and 17 that partially remain by a loading effect due to non-uniformity of the process and the difference in the pattern density upon completion of the etch process, a lower step coverage, non-uniformity of composition of the etch subject layer, and the like. The over-etch process time is normally performed as an additional etch process in the range of 30 through 100% based on the process time of the etch subject layers 13, 15 and 17. If the thickness of the etch subject layers 13, 15 and 17 is increased, the thickness of the remnant remained after the etch process is increased. Thus, the over-etch process time is also increased. Due to this, the over-etch process is overly performed in order to completely remove the remnant considering that the lower conductive layers 11, 12, 14 and 16 may be damaged by some degree. However, as etching of the etch subject layers 13, 15 and 17 in the main etch process is already completed, portions through which the lower conductive layers 11, 12, 14 and 16 are exposed are additionally etched from the time when the over-etch process begins to expose. Therefore, the characteristic of the device is degraded due to damage of the lower conductive layers 11, 12, 14 and 16, and a phenomenon that an electric charge is accumulated on the surface of the lower conductive layers 11, 12, 14 and 16. In order to minimize damage of the lower conductive layers 11, 12, 14 and 16, the over-etch process is performed under a condition that the etch select ratio for the lower conductive layers 11, 12, 14 and 16 is high. In order to minimize degradation in the device characteristic due to accumulation of the electric charge, the over-etch process time is set up so that the over-etch process time is minimized. However, the select ratio that can be obtained in view of the etch process and the over-etch process time that can be reduced are limited.

In case of the substrate contact hole C2 or the word line contact hole C1 among the lower conductive layers 11, 12, 14 and 16, the depths of which is deep, there is a case that the surface of the semiconductor substrate 11 in the active region and the word line 12 are not exposed upon the main etch process. In this case, a phenomenon that electric charges are accumulated only on the surface of the insulating material of the etch subject layers 13, 15 and 17 by plasma is occurred. Therefore, a phenomenon is not generated that the electric charges for the semiconductor substrate 11 or the word line 12 are accumulated. During the over-etch process where the lower conductive layers 11, 12, 14 and 16 start to expose, an electric field is formed due to non-uniform accumulation of electric charges through the cross section of the exposed contact. Also, plasma-introduced electric charge current is generated by Fowler-Nordheim tunneling phenomenon by which the underlying substrate becomes a common electrode by the difference in the potential. Due to this, the lower unit device is damaged. Also, plasma-introduced damage is increased in proportion to the time of the over-etch process since it is proportion to the amount of the electric charge accumulated.

Therefore, after the word line, the bit line and the capacitor structure are all formed in the cell region, in order to simultaneously form a metal line for cell driving at a peripheral circuit region, the process of forming a metal contact on the word line, the bit line, and the upper and lower electrodes of the capacitor includes simultaneously etching the contact holes of various depths. Therefore, as the contact holes having a swallow depth like the upper electrode contact of the capacitor is exposed to the over-etch process for a long period of time, plasma-introduced damage is increased.

SUMMARY OF THE INVENTION

The present invention is contrived to solve the above problems and an object of the present invention is to provide a method of manufacturing a semiconductor device capable of improving an electric characteristic and reliability of the device by reducing plasma-introduced damage of a lower unit device upon a metal contact process for connecting the lower unit device and an upper metal line.

In order to accomplish the above object, a method of manufacturing a semiconductor device according to the present invention, is characterized in that it comprises the steps of forming a word line on a semiconductor substrate and then forming a word line/substrate etch stopper on the semiconductor substrate including the word line, forming a first interlayer insulating film on the an entire structure including the word line/substrate etch stopper, forming a bit line on the first interlayer insulating film and then forming a bit line etch stopper on the bit line, forming a second interlayer insulating film on the entire structure including the bit line etch stopper, forming a capacitor on the second interlayer insulating film and then forming a capacitor etch stopper on the capacitor, forming a third interlayer insulating film on the entire structure including the capacitor etch stopper, forming a photoresist pattern for forming contact holes on the third interlayer insulating film, etching the first, second and third interlayer insulating films by means of a first plasma dry etch process using the photoresist pattern as an etch mask to form the contact holes exposing the bottom of each of the word/substrate etch stopper, the bit line etch stopper and the capacitor etch stopper, and removing each of the word/substrate etch stopper, the bit line etch stopper and the capacitor etch stopper exposed at the bottoms of the contact holes by means of a second plasma dry etch process to complete the contact holes.

BRIEF DESCRIPTION OF THE DRAWINGS

The aforementioned aspects and other features of the present invention will be explained in the following description, taken in conjunction with the accompanying drawings, wherein:

FIG. 2A and FIG. 2B are cross-sectional views of semiconductor devices for explaining a method of manufacturing the device according to a preferred embodiment of the present invention.

DETAILED DESCRIPTION OF PREFERRED EMBODIMENTS

Figure 1:
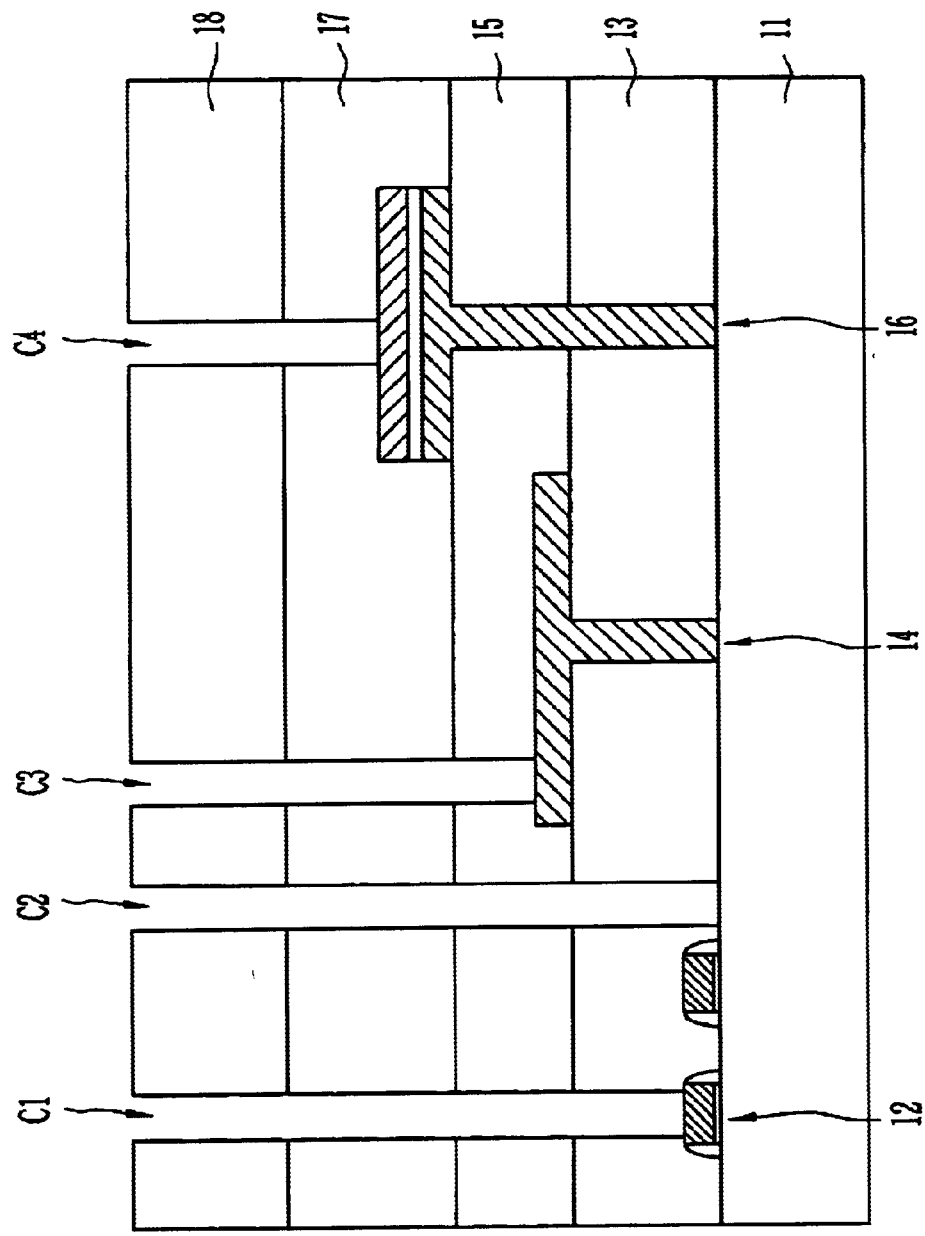
FIG. 1 is a cross-sectional view of a semiconductor device for explaining a conventional method of manufacturing the device.

The present invention will be described in detail by way of a preferred embodiment with reference to accompanying drawings, in which like reference numerals are used to identify the same or similar parts.

FIG. 2A and FIG. 2B are cross-sectional views of semiconductor devices for explaining a method of manufacturing the device according to a preferred embodiment of the present invention.

Referring now to FIG. 2A, a word line 22 is formed on a semiconductor substrate 21. A word line/substrate etch stopper 220 is then formed on the semiconductor substrate 21 including at least the word line 22. Next, a first interlayer insulating film 23 of which the surface is planarized is formed on the entire structure including the word line/ substrate etch stopper 220. Thereafter, a portion of the first interlayer insulating film 23 is etched, and the bit line 24 connected to the semiconductor substrate 21 through the etched portion is then formed on the first interlayer insulating film 23. Then, a bit line etch stopper 240 is formed on the bit line 24. Next, a second interlayer insulating film 25 of which the surface is planarized is formed on the entire structure including the bit line etch stopper 240. Thereafter, portions of the first and second interlayer insulating films 23 and 25 are etched, and a capacitor 26 connected to the semiconductor substrate 21 through the etched portions is then formed on the second interlayer insulating film 25. A capacitor etch stopper 260 is then formed on the capacitor 26. Next, a third interlayer insulating film 27 of which the surface is planarized is formed on the entire structure including the capacitor etch stopper 260.

In the above, each of the word line/substrate etch stopper 220, the bit line etch stopper 240 and the capacitor etch stopper 260 is formed by depositing an oxide-serial material usually used to form the first through third interlayer insulating films 23, 25 and 27, and a material having a high etch select ratio, for example, a nitride-serial material of 10 through 10,000 Å in thickness.

As such, the lower unit device is completed by the above process. A metal contact process of connecting the lower unit device and a metal line is then performed.

The metal contact process includes forming a photoresist pattern 28 through which each of the portions of the word line 22, the semiconductor substrate 21 in the active region, the bit line 24 and the capacitor 26 opened on the third interlayer insulating film 27, and sequentially etching the third, second and first interlayer insulating films 27, 25 and 23 by means of a first plasma dry etch process using the photoresist pattern 28 as an etch mask, thus forming contact holes C1, C2, C3 and C4.

The first plasma dry etch process includes a main etch process for the etch subject layers 27, 25 and 23, and an over-etch process that is performed from the time when the etch stoppers 220, 240 and 260 on the lower conductive layers 21, 22, 24 and 26 begin to expose. The word line contact hole C1 through which a portion of the word line/substrate etch stopper 220 on the word line 22 is exposed, the substrate contact hole C2 through which a portion of the word line/substrate etch stopper 220 on the semiconductor substrate 21 in the active region is exposed, the bit line the contact hole C3 through which a portion of the bit line etch stopper 240 on the bit line 24 is exposed, and the capacitor contact hole C4 through which a portion of the capacitor etch stopper 260 on the capacitor 26 is exposed, are simultaneously formed by the above processes. Each of the word line contact hole C1, the substrate contact hole C2, the bit line contact hole C3 and the capacitor contact hole C4 has a different path since the lower conductive layers 21, 22, 24 and 26 are formed at different positions of the four contact holes C1, C2, C3 and C4.

In the above, the over-etch process is performed in order to remove the etch subject layers 23, 25 and 27 that partially remain due to a loading effect by non-uniformity of the process and the difference in the pattern density upon completion of the etch process, a lower step coverage, non-uniformity of composition of the etch subject layer, and the like. The over-etch process of the first plasma dry etch process includes selectively etching the etch subject layers 23, 25 and 27 without exposing the lower conductive layers 21, 22, 24 and 26 at the select ratio of 20:1 for the etch stoppers 220, 240 and 260 made of a nitride-serial material using $C_5F_8$ gas as a main etch gas. Also, the over-etch process of the first plasma dry etch process includes selectively etching the etch subject layers 23, 25 and 27 without exposing the lower conductive layers 21, 22, 24 and 26 in the range of 1 through 300% based on the main etch process time of the etch subject layers 23, 25 and 27.

Referring now to FIG. 2B, the first plasma dry etch process using the photoresist pattern 28 as an etch mask is performed to sequentially etch the third, second and first interlayer insulating films 27, 25 and 23, thus forming the contact holes C1, C2, C3 and C4 exposing the bottoms of the etch stoppers 220, 240 and 260, as shown in FIG. 2A. A second plasma dry etch process using the photoresist pattern 28 as an etch mask is performed to remove the exposed portions of the etch stoppers 220, 240 and 260. Due to this, the word line contact hole C1 through which a portion of the word line 22 is exposed, the substrate contact hole C2 through which a portion of the semiconductor substrate 21 in the active region is exposed, the bit line contact hole C3 through which a portion of the bit line 24 is exposed, and the capacitor contact hole C4 through which a portion of the capacitor 26 is exposed, are simultaneously formed.

In the above, the second plasma dry etch process includes the main etch process for the etch stoppers 220, 240 and 260, and the over-etch process that is performed from the time when the lower conductive layers 21, 22, 24 and 26 begin to expose.

The over-etch process of the second plasma dry etch process employs a $CH_2F_2/C_2HF_5$ gas as a main etch gas and is performed to expose the lower conductive layers 21, 22, 24 and 26 in the range of 1 through 300% based on the main etch process time of the etch stoppers 220, 240 and 260.

Meanwhile, in the embodiment of the present invention, an explanation on the case that the photoresist pattern 28 is formed on the third interlayer insulating film 27 has been made. In order to more efficiently form the contact holes C1, C2, C3 and C4, however, it should be noted that a hard mask layer 29 may be formed on the third interlayer insulating film 27 by an additional process, the photoresist pattern 28 may be formed on the hard mask layer 29 and the contact holes C1, C2, C3 and C4 may be then formed by the first and second plasma etch processes.

It is preferred that the hard mask layer 29 additionally formed is formed to have the same material and thickness as the etch stoppers 220, 240 and 260 that are used in the present invention. In other words, the hard mask layer 29 is deposited using a nitride-serial material in thickness of 10 through 10,000 Å. The hard mask layer 29 additionally formed is removed upon the over-etch process of the second plasm etch process for forming the contact holes C1, C2, C3 and C4.

In the above, the word/substrate etch stopper, the bit line etch stopper and the capacitor etch stopper of a nitride-serial material are formed between the etch subject layer and the lower conductive layers, respectively. Therefore, damage of an underlying device by accumulation of an electric charge due to exposure of the lower conductive layers among the over-etch process of the existing metal contact process to plasma, can be reduced by the over-etch process of the etch stopper of which the process time is relatively shortened.

In case that the device is manufactured by the present embodiment, damage of the underlying device due to plasma-introduced damage can be reduced. The reason of which will be explained as follows.

For example, in case of the contact etch process of 20,000 Å in thickness (in case of the word line contact among the metal contact process) under the condition that $C_2F_6/C_4F_8$ is used as a main etch gas, the etch rate is 10,000 Å/min and the over-etch process is 50% based on the main etch process, the over-etch process time when damage due to an accumulated electric charge corresponds to 60 seconds (time when 10,000 Å being 50% for the main etch thickness is etched since the thickness of the etch subject layer is 20,000 Å). In other words, in case that the contact holes are formed by the conventional method, the word line being the underlying device is plasma-introduced damaged during 60 seconds being the over-etch process time.

In the present invention, however, the underlying device is not plasma-introduced damaged due to the etch stopper even though the etch subject layer is etched by the above conventional condition. In case that the etch stopper is deposited in thickness of 3,000 Å using a nitride-series material and the etch subject layer made of an oxide-series material is etched using $C_5F_8$ gas having the select ratio of against nitride as a main etch gas, the main etch process is performed using an etch target of 20,000 Å and the etch stopper of a nitride-series material is then etched by only about 1,500 Å during the time when the over-etch process (etch target of 10,000 Å of 50% based on the main etch process is completed. Therefore, the underlying device is not damaged. At this time, if the remaining etch stopper of 1,500 Å in thickness is removed, the contact holes are completed. Thus, if $CH_2F_2/C_2HF_5$ is used as a main etch gas and the etch rate is 20,000 Å/mm, the underlying device is damaged only in the over-etch process of below 3 seconds against the etch stopper.

As a result of comparing the conventional method and the present method, it was found that the underlying device was plasma-introduced damaged during 60 seconds in the conventional method but the underlying device was plasma-introduced damaged during 3 seconds in the present method. As a result, it was found that the present invention can reduce damage of the underlying device due to accumulated electric charges by 95% compared to the conventional method. In particular, assuming that the depth of the contact holes is 10,000 Å in case that the capacitor contact holes in which the depth of the contact holes is the most swallow, the over-etch process time in the conventional method is 120 seconds. In the present invention, the capacitor is damaged only in the over-etch process of less than 3 seconds for the remaining etch stopper of 1,500 Å in thickness. Therefore, the present invention can reduce damage of the capacitor due to accumulated electric charge by 97.5%.

As mentioned above, according to the present invention, an electric charge generated during the over-etch process time in proportion to the entire thickness of the etch subject layer is accumulated by only the over-etch process time for the etch stopper, thus reducing damage of accumulated electric charges by over 90%. Due to this, plasma-introduced damage of a lower unit device is reduced upon a metal contact process for connecting the lower unit device and an upper metal line. Therefore, the present invention has an outstanding advantage in that it can improve an electrical characteristic and reliability of the device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising the steps of:

forming a word line on a semiconductor substrate;

forming a word line/substrate etch stopper on the semiconductor substrate including the word line;

forming a first interlayer insulating film on an entire structure including the word line/substrate etch stopper;

forming a bit line on the first interlayer insulating film;

forming a bit line etch stopper on the bit line;

forming a second interlayer insulating film on the entire structure including the bit line etch stopper;

forming a capacitor on the second interlayer insulating film;

forming a capacitor etch stopper on the capacitor;

forming a third interlayer insulating film on the entire structure including the capacitor etch stopper;

forming a photoresist pattern for forming contact holes on the third interlayer insulating film;

etching the first, second and third interlayer insulating films by means of a first plasma dry etch process using the photoresist pattern as an etch mask to form the contact holes exposing a bottom of each of the word/substrate etch stopper, the bit line etch stopper and the capacitor etch stopper; and removing each of the word/substrate etch stopper, the bit line etch stopper and the capacitor etch stopper exposed at the bottoms of the contact holes by means of a second plasma dry etch process to complete the contact holes.

2. The method as claimed in claim 1, wherein the first, second and third interlayer insulating films are made of an oxide-series material.

3. The method as claimed in claim 1, wherein the word/substrate etch stopper, the bit line etch stopper and the capacitor etch stopper are formed by depositing a nitride-series material in thickness of 10 through 10,000 Å.

4. The method as claimed in claim 1, wherein the first plasma dry etch process includes a main etch process for the first, second and third interlayer insulating films and an over-etch process that is performed from the time when the capacitor etch stopper begins to expose.

5. The method as claimed in claim 4, wherein the over-etch process selectively etches the first, second and third interlayer insulating films at the select ratio of 20:1 for the word/substrate etch stopper, the bit line etch stopper and the capacitor etch stopper using $C_5F_8$ gas as a main etch gas.

6. The method as claimed in claim 4, wherein the over-etch process selectively etches the first, second and third interlayer insulating films in the range of 1 through 300% based on the main etch process time.

7. The method as claimed in claim 1, wherein the second plasma dry etch process includes a main etch process for the word/substrate etch stopper, the bit line etch stopper and the capacitor etch stopper and an over-etch process that is performed from the time when one of the underlying layers of the word/substrate etch stopper, the bit line etch stopper and the capacitor etch stopper begins to expose.

8. The method as claimed in claim 7, wherein the over-etch process is performed using $CH_2F_2/C_2HF_5$ gas as a main etch gas.

9. The method as claimed in claim 7, wherein the over-etch process is performed in the range of 1 through 300% based on the main etch process time.

10. The method as claimed in claim 1, further comprising the step of forming a hard mask layer between the third interlayer insulating film and the photoresist pattern.

11. The method as claimed in claim 10, wherein the hard mask layer is formed by depositing a nitride-series material in thickness of 10 through 10,000 Å.

* * * * *